(12) United States Patent
Schoenbauer

(10) Patent No.: US 7,113,020 B2
(45) Date of Patent: Sep. 26, 2006

(54) CAPACITANCE MULTIPLIER CIRCUIT EXHIBITING IMPROVING BANDWIDTH

(75) Inventor: Steve Schoenbauer, Colorado Springs, CO (US)

(73) Assignee: Toko, Inc., (JP)

( * ) Notice: Subject to any disclaimer, the term of this patent is extended or adjusted under 35 U.S.C. 154(b) by 144 days.

(21) Appl. No.: 10/973,885

(22) Filed: Oct. 25, 2004

(65) Prior Publication Data

US 2006/0087345 A1 Apr. 27, 2006

(51) Int. Cl.
*H03H 11/40* (2006.01)
*G05F 1/10* (2006.01)
*G05F 3/02* (2006.01)
*H03F 1/36* (2006.01)

(52) U.S. Cl. .................. 327/524; 327/541; 330/85; 330/260

(58) Field of Classification Search .............. 330/7
See application file for complete search history.

(56) References Cited

U.S. PATENT DOCUMENTS

| | | | |
|---|---|---|---|
| 5,900,771 A * | 5/1999 | Bremner ................. | 327/524 |
| 6,084,475 A * | 7/2000 | Rincon-Mora .......... | 330/255 |
| 6,633,193 B1 * | 10/2003 | Halamik et al. ........ | 327/334 |
| 6,812,778 B1 * | 11/2004 | Yeo et al. ............... | 327/541 |
| 2003/0071675 A1 * | 4/2003 | Stair et al. .............. | 327/356 |

* cited by examiner

*Primary Examiner*—Rexford Barnie
*Assistant Examiner*—Dylan White
(74) *Attorney, Agent, or Firm*—William E. Hein

(57) ABSTRACT

A monolithic capacitance multiplication circuit serves to reduce the required die area when larger capacitance values are needed such as in filter and loop frequency compensation circuits. A current mirror/cascoding device arrangement reduces the effective series resistance of the multiplier capacitor. As a result, the multiplier topology exhibits improved bandwidth over prior art capacitance multiplier circuits.

5 Claims, 5 Drawing Sheets

CAPACITANCE MULTIPLIER CIRCUIT EXHIBITING IMPROVING BANDWIDTH

BACKGROUND AND SUMMARY OF THE INVENTION

The present invention relates to monolithic circuit topologies which function to magnify the apparent size of a capacitor that is used in a AC filtering or compensation applications.

In integrated circuit designs, there is occasionally the need to use a relatively large capacitance to achieve the desired circuit performance. For example, to stabilize the feedback loop found in a phase lock loop or in a linear switch-mode voltage regulator, a low frequency zero can be installed in the loop gain to enhance the phase margin and improve transient response. Larger capacitance values on the order of tens of picofarads or more may be required, depending on the particular loop crossover frequency and circuit impedance levels.

Unfortunately, a substantial die area may be incurred in the construction of these capacitors. In particular, in some 0.6 uM CMOS processes, a poly-poly capacitor may require about 800 $\mu M^2$ per picofarad of capacitance. Alternatively, larger capacitors may also be placed external to the die, but at the expense of a pin-out increase and reduced convenience at the application level.

A capacitance multiplier circuit in which a smaller monolithic capacitance appears to have the current and □V/□T characteristic of a larger capacitor may be useful in these instances. The reduction in chip area can reduce the IC cost and/or leave extra area for other circuits on the die.

Capacitance multiplier circuits are known in the prior art. U.S. Pat. Nos. 5,900,771 and 6,084,475 describe both bipolar and CMOS capacitance multipliers using basic current mirror techniques. In accordance with both of these references, the circuit topology is arranged to sum a capacitive current directly into a diode-connected device (gate and drain tied on MOS or CB in bipolar), which serves as the input side of a mirror structure.

In terms of frequency response, the known mirror-based approaches have a bandwidth limit imposed by the series resistance of the sensing path. At high frequencies, this limit causes the circuit to appear to be resistive rather than to exhibit the desired capacitive behavior. In terms of the AC pole-zero response, a zero is inadvertently inserted by the series resistance. Hence, the range and performance of filter and compensator networks using these multipliers may very well be limited.

By contrast, the present invention employs a cascoded current summing topology, in which a capacitive current is summed into a virtual node formed by the source-drain connection of two transistors. This arrangement reduces the series resistance of the current sensing path. As a consequence, the present multiplier circuit remains capacitive at higher frequencies than are possible using prior art mirror approaches. This attribute is beneficial to the performance of filters and compensator networks in which the capacitance multiplier may be used. In particular, the resulting higher bandwidth permits greater design flexibility since the zero frequency has been pushed higher, often outside of the critical range.

In accordance with the illustrated preferred embodiment of the present invention, a capacitance multiplier circuit is provided having two external nodes (an output node and a return node). Between these two external nodes, the circuit electrically multiplies the apparent size of a capacitor having its first terminal connected to the output node and its second terminal connected to a first internal node of the circuit.

The first internal node is connected to the second terminal of the capacitor and to a first MOS transistor drain terminal and a second MOS transistor source terminal. At a second internal node, the gate of the first MOS transistor is connected to the drain terminal of the second MOS transistor. In addition, the gate terminal of a third MOS transistor is connected to the second internal node together with the first terminal of an external bias current source. The drain and source terminals of the third MOS transistor are connected between the output node and the return node, respectively.

The amount of capacitance multiplication by the circuit of the present invention is determined by a ratio factor K, greater than unity, that is representative of the physical sizes of the first and third transistors. That is, the third transistor is K times larger than the first transistor.

DETAILED DESCRIPTION OF THE PREFERRED EMBODIMENT

Figure 1:
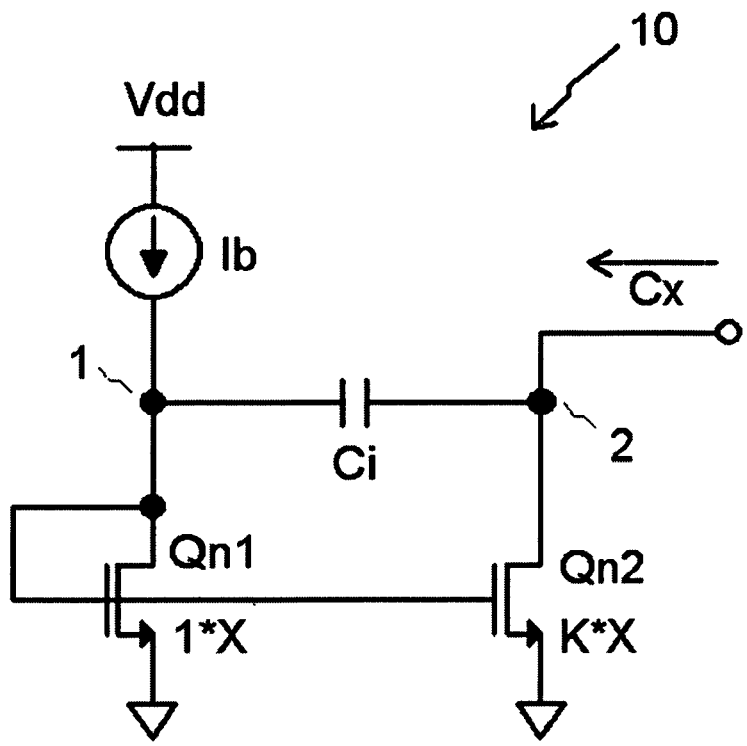
FIG. 1 is a schematic diagram of a prior art circuit that employs capacitance multiplication.

Referring first to FIG. 1, there is shown a prior art capacitance multiplier circuit 10. This circuit is biased by current source Ib. The direct current from source Ib flows through a diode-connected transistor Qn1, thereby establishing an operating voltage at node 1. The drain terminal of transistor Qn2 is biased such that Qn2 operates in the pinch-off region. The factor K represents the size ratio of Qn2 to Qn1. K is usually assumed to be a positive number greater than unity.

Figure 3A:
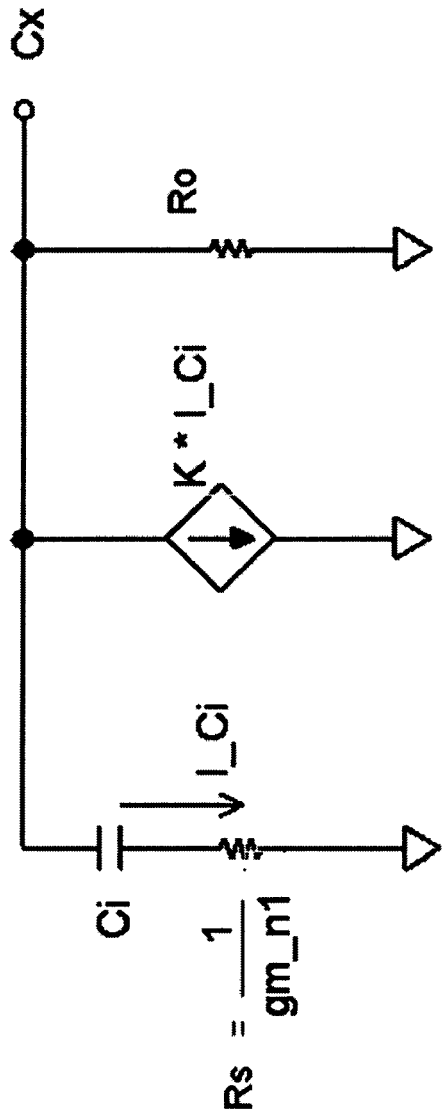
FIGS. 3a and 3b are diagrams illustrating the small signal model representations of the circuits of FIGS. 1 and 2, respectively.

With these operating conditions established on devices Qn1 and Qn2, the small signal model shown in FIG. 3a can be applied to evaluate the bandwidth performance of the circuit 10. It should be noted that I_Ci represents the current in capacitor Ci.

Figure 2:
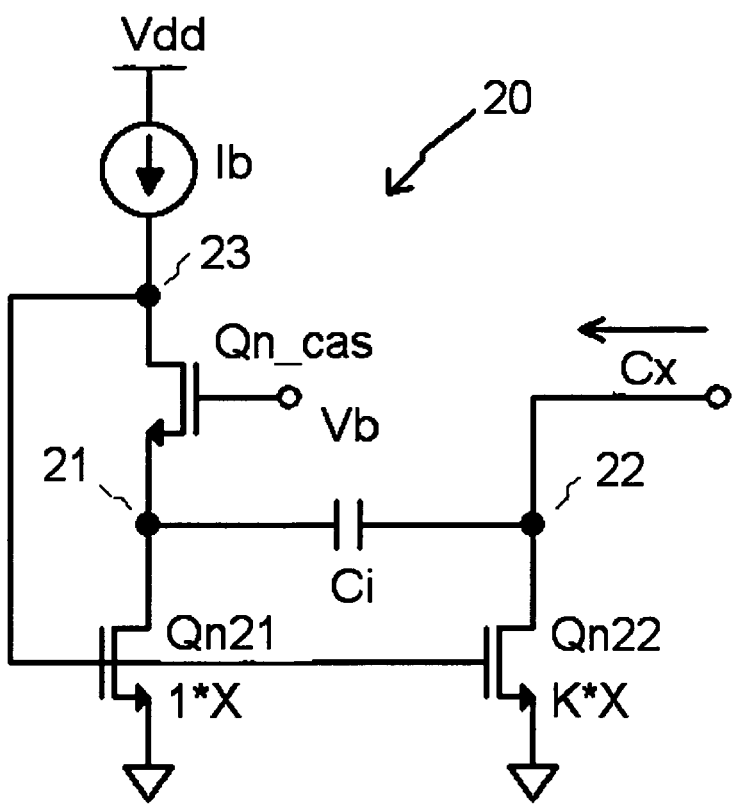
FIG. 2 is a schematic diagram of a capacitance multiplier circuit in accordance with the present invention.

Referring now to FIG. 2, there is shown a detailed schematic diagram of a capacitance multiplier circuit 20 in accordance with the present invention. This circuit is biased by a current source Ib. The direct current from source Ib flows through transistors Qn_cas and Qn1, thereby establishing an operating voltage at node 23. Voltage level Vb at the gate terminal of Qn_cas establishes an operating point at node 21. The voltage levels at nodes 21 and 23 are such that both transistors Qn21 and Qn_cas operate in the linear (pinch-off) regions. The drain terminal of transistor Qn22 is biased such that Qn22 also operates in the pinch-off region.

Figure 3B:
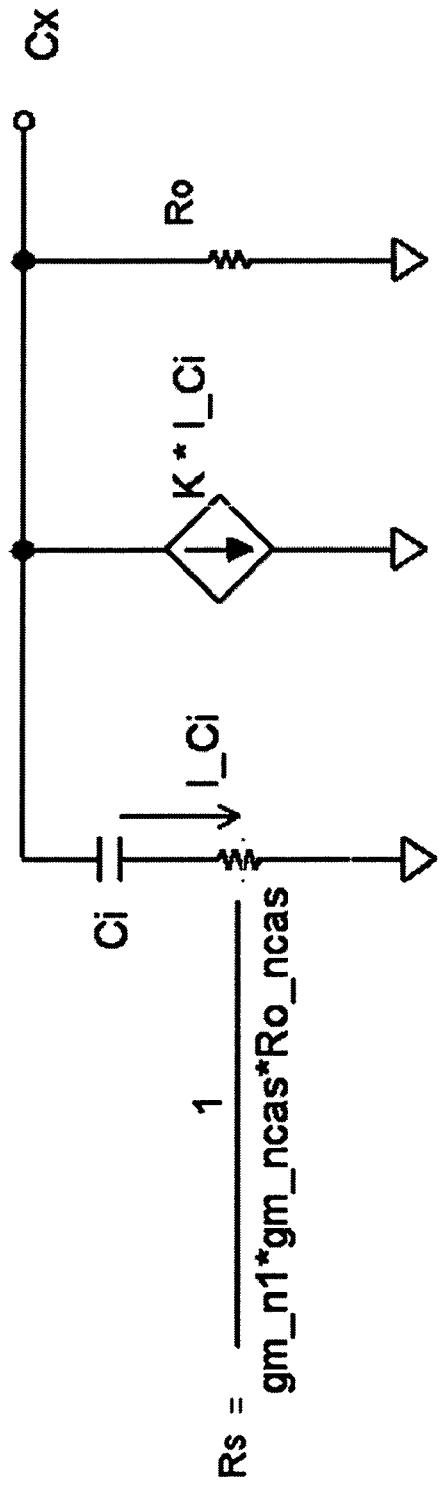

With these operating conditions established for transistors Qn1, Qn2, Qn_cas, the small signal model shown in FIG. 3b can be applied to evaluate the capacitance multiplication feature of the circuit 20.

A key attribute of the models of both FIGS. 3a and 3b is the series resistance Rs. In the prior art circuit of FIG. 1, resistance Rs is introduced by the diode-connected part of Qn1 connected to node 1. In the case of the circuit of FIG. 2, Rs is the effective resistance looking into node 21.

It should be noted for purposes of the following description that the impedance of capacitor Ci is given by the equation $$ZCi = \left(\frac{1}{\omega C_i}\right)$$

The following five equations indicate how the parameter Rs influences the bandwidth of the present capacitance multiplier circuit.

Referring now to FIGS. 3a and 3b, the impedance looking into terminal Cx can be expressed as $$ZCx = \left[\frac{1}{K+1}\right]\left(\frac{1}{\omega C_i} + R_S\right)$$

For low frequencies at which ZCi is much less than Rs, this impedance can be further approximated as $$ZCx \approx \left[\frac{1}{(K+1)\omega C_i}\right]$$

This expression gives an effective capacitance looking into terminal Cx of $$Cx \approx (K+1)C_i$$

Hence, at low frequencies, this circuit is effectively a capacitance multiplier having a multiplication factor of (K+1).

However, for higher frequencies, at which Rs is much less than ZCi, the impedance ZCx into terminal Cx looks resistive rather than capacitive, with a resistance approximated by the expression $$ZCx \approx \left[\frac{R_S}{K+1}\right]$$

There exists a critical frequency, where ZCi=Rs, at which a zero occurs in the impedance function seen at terminal Cx of the multiplier circuit. It can be said that this frequency represents a bandwidth limit for the circuit. The frequency of this zero can be expressed as $$Fz = \frac{1}{2\pi R_S C_i}$$

It is apparent from the equation above that the bandwidth of the capacitance multiplier circuit of FIG. 2 can be extended (Fz increased) by reducing series resistance Rs.

In the case of the prior art circuit of FIG. 1, Rs is formed primarily by the size and biasing of transistor Qn1. In particular, Rs=1/gm_Qn1.

The reduction of Rs can be accomplished in the circuit of FIG. 1 by increasing the size of transistor Qn1 or the bias current Ib flowing therein. However, these approaches have the attendant drawbacks of increased die area and decreased circuit efficiency. This is particularly true since the factor 1/gm_Qn1 only decreases as the square root of increases in bias current Ib or width of transistor Qn1.

As set forth in detail above, the capacitance multiplier circuit of the present invention provides a way of reducing resistance Rs and thereby extending the bandwidth of the circuit without incurring the penalties inherent in prior art circuits. In the cascode topology of the circuit of FIG. 2, the resistance Rs is reduced as a consequence of the voltage gain at node 23.

As illustrated in FIG. 3b, resistance Rs is reduced by an additional factor of approximately 1/(gm_ncas*Ro_ncas). As a result, in practical applications, it is has been possible to achieve bandwidth extension by a factor of 8. A small price is paid in the die area required by transistor Q_ncas of FIG. 2. Another possible bandwidth enhancement that may be accomplished by the capacitance multiplier circuit of FIG. 2 involves driving the gate of transistor Qn_cas with an amplifier output instead of the fixed bias level Vb. In this amplified cascode technique, the amplifier exhibits a negative gain and receives an input from node 22. The amplified cascode technique can further reduce the value of resistance Rs and further extend the bandwidth of the circuit.

For the purpose of illustrating the benefit of the circuit of the present invention, a simulation test circuit was constructed by connecting a voltage source with a series test resistor to terminal Cx of the prior art circuit of FIG. 1 and then to terminal Cx of applicant's circuit of FIG. 2. In this instance, the series test resistor had a value of 88 Kohm and the internal capacitor Ci was 15 pF. This test configuration forms a low-pass RC filter by using the capacitance multiplier circuit as the capacitive element in the filter. For this simulation, the bias current Ib, as well as device geometries for the mirror transistors and capacitor Ci were maintained the same in both the circuits of FIGS. 1 and 2.

Figure 4:
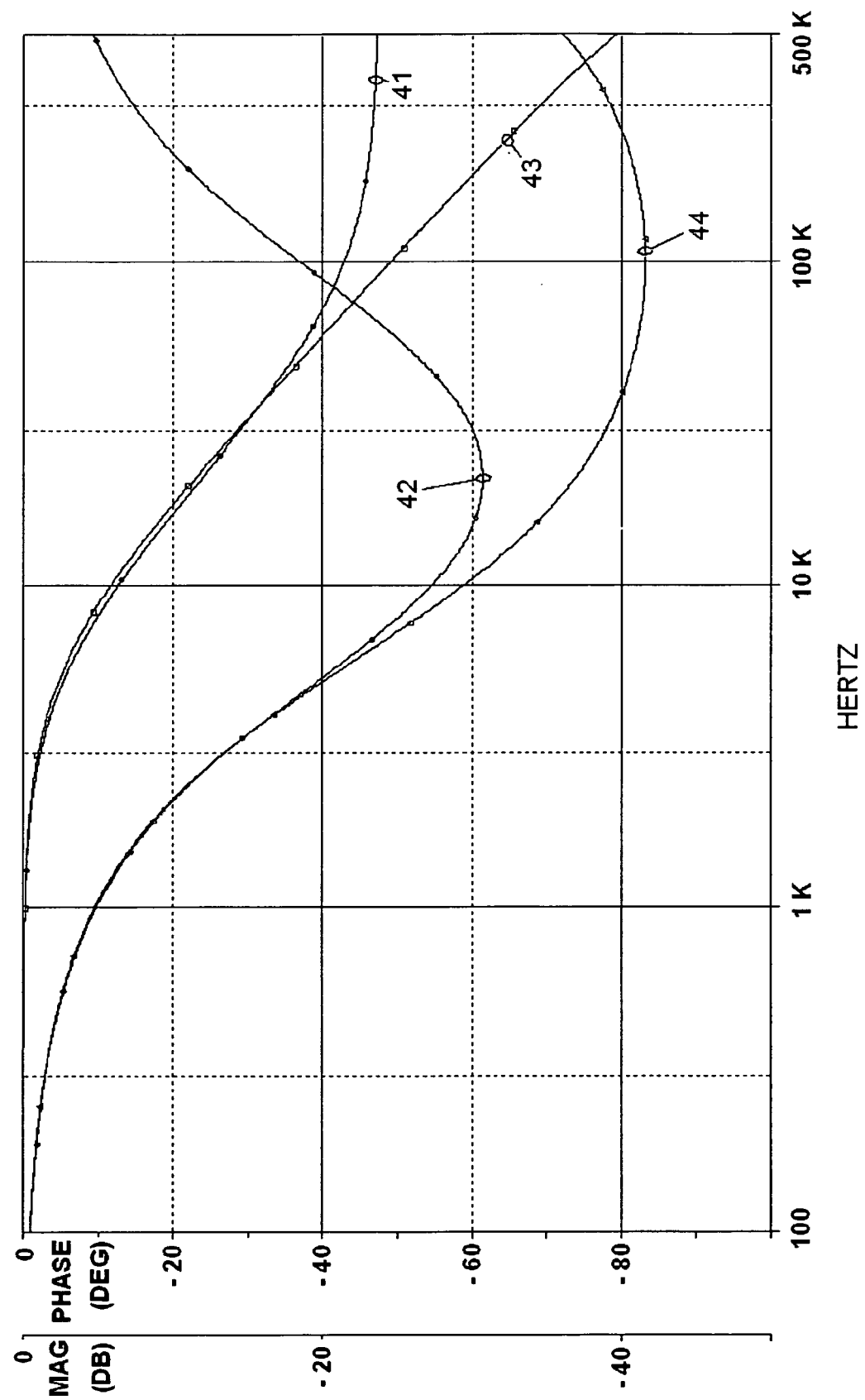
FIG. 4 illustrates a graphical plot of the magnitude and phase response of both the circuits of FIGS. 1 and 2.

Referring now to FIG. 4, there are shown the frequency and phase response curves 41, 42 of the test circuit when applied to the prior art circuit of FIG. 1, together with the frequency and response curves 43, 44 generated by the circuit of FIG. 2. The effective bandwidth extension benefits of the capacitance multiplier circuit of the present invention are clearly apparent from a comparison of these two sets of curves.

Figure 5:
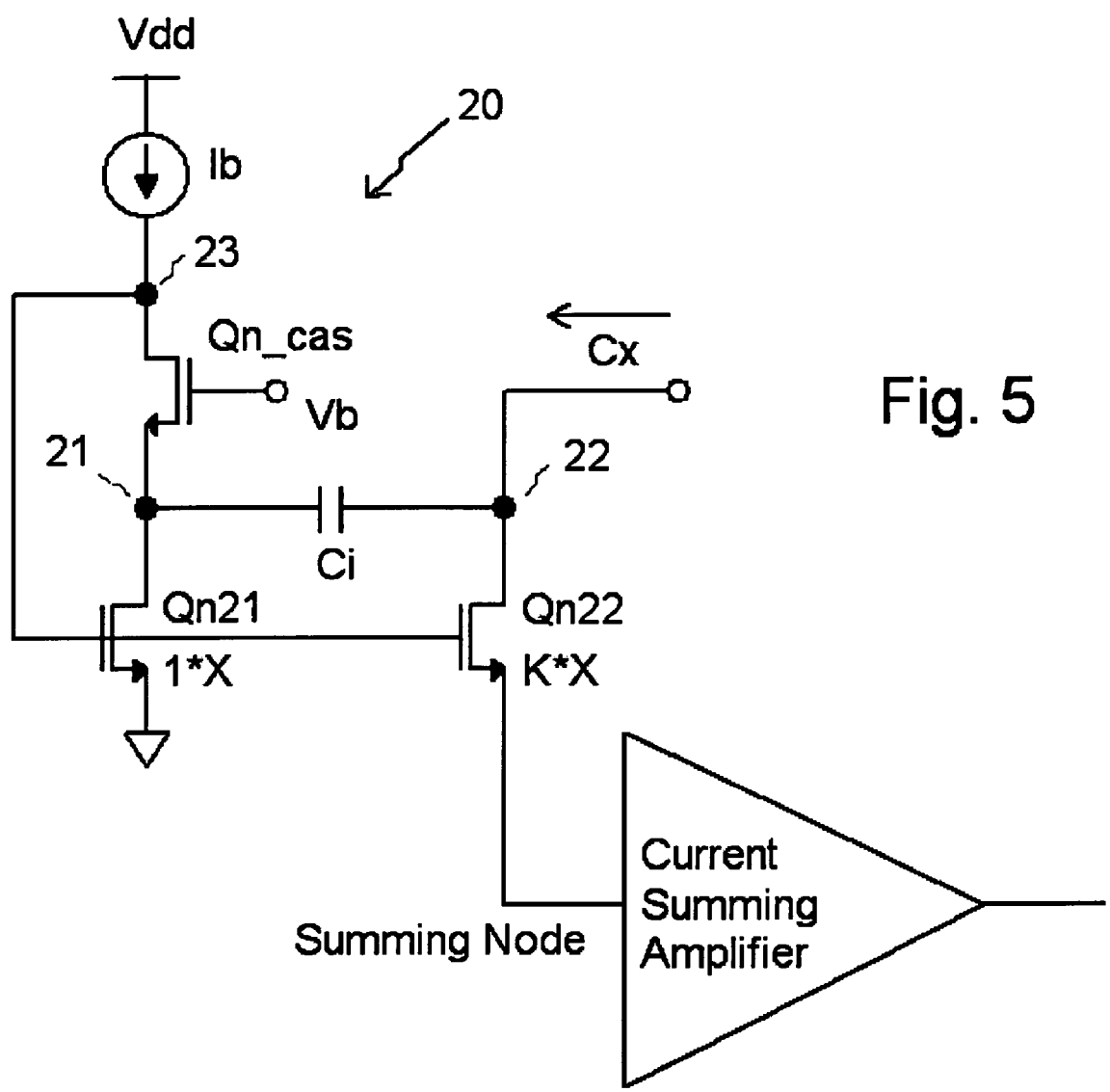
FIG. 5 is a schematic diagram of an enhanced capacitance multiplier circuit in accordance with the present invention that employs a summing amplifier.

Referring now to FIG. 5, there is shown an embodiment of a capacitance multiplier circuit in which the virtual node of a supplementary current summing amplifier receives the source current from Qn22.

Figure 6:
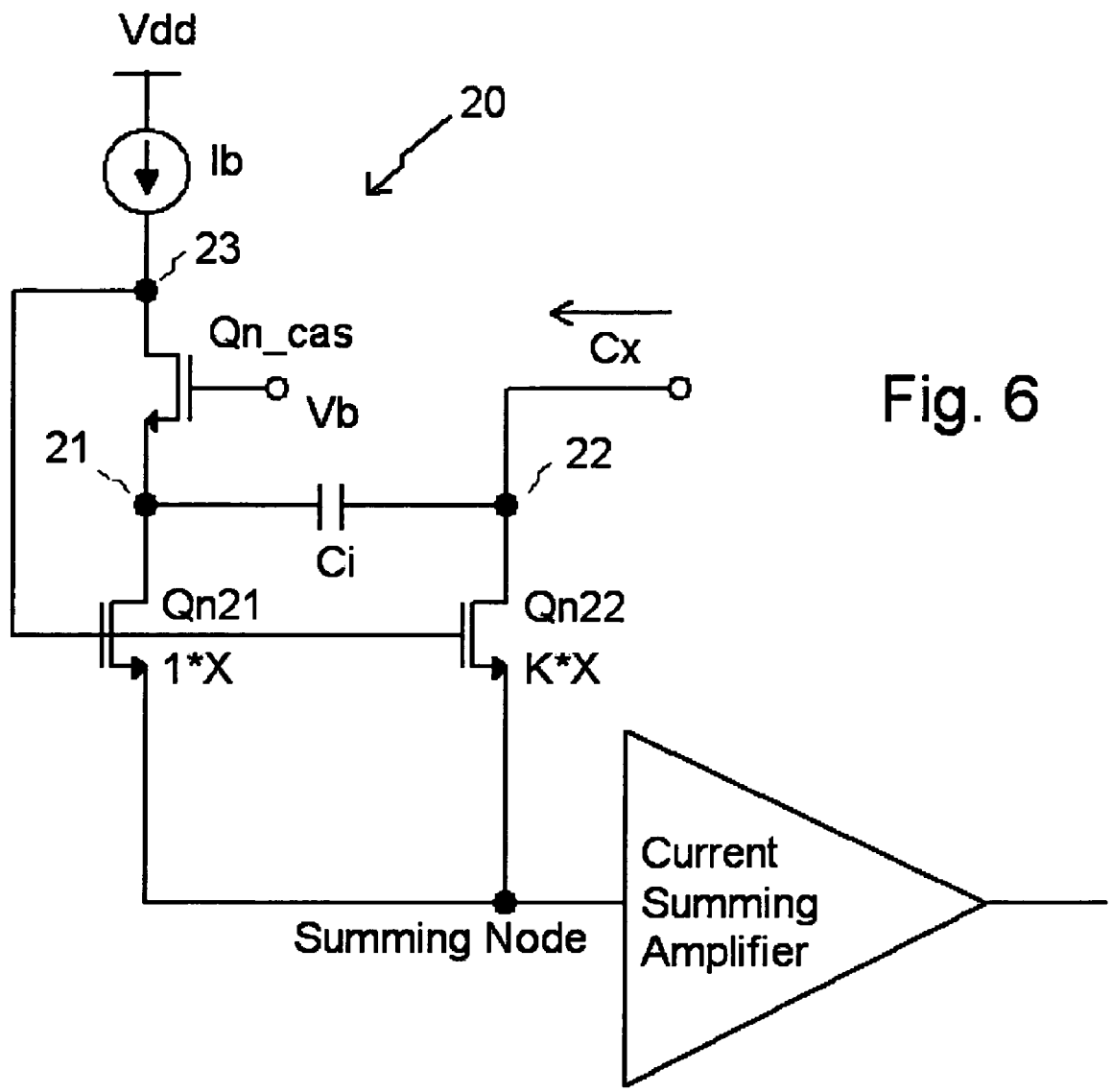
FIG. 6 is a schematic diagram of another embodiment of the enhanced capacitance multiplier circuit of FIG. 5.

Referring now to FIG. 6, there is shown another embodiment of a capacitance multiplier circuit in which the virtual node of the supplementary current summing amplifier receives the source current from both Qn22 and Qn21. The enhanced topology of the circuits of FIGS. 5 and 6 provides greater flexibility in those situations in which it is desired not to ground the low side of the multiplied capacitor. In both of these topologies, the current flowing in both terminals of the multiplier capacitor is available for use.

I claim:

1. A monolithic capacitance multiplier circuit comprising:
   a first FET device for supplying a bias current, a gate terminal of said first FET device being connected to a source of bias voltage;
   a current source connected between a source of operating voltage and a drain terminal of said first FET device;
   a second FET device connected in cascode to said first FET device;
   a third FET device;
   a capacitor connected between drain terminals of said second and third FET devices;
   a current summing node, formed at a connection of a source terminal of said first FET device, said drain terminal of said second FET device, and one plate of said capacitor, at which a capacitive current flowing from said capacitor is summed with said bias current, a resulting total current flowing into said drain terminal of said second FET device;

a control node, formed at a connection of said current source, a gate terminal of said second FET device, and a gate terminal of said third FET device; and an output node, formed at a connection of a drain terminal of said third FET device and the other plate of said capacitor.

2. A capacitance multiplier circuit as in claim 1, wherein a size parameter of said third FET is greater than a corresponding size parameter of said second FET.

3. A capacitance multiplier circuit as in claim 2, wherein said size parameter comprises the quotient of a FET channel width and a FET channel length.

4. A capacitance multiplier circuit as in claim 1, further comprising an amplifier circuit having a current summing node connected to a source terminal of said third FET device.

5. A capacitance multiplier circuit as in claim 1, further comprising an amplifier circuit having a current summing node connected to a source terminal of each of said second and third FET devices.

* * * * *